US007015138B2

(12) United States Patent
Pan et al.

(10) Patent No.: US 7,015,138 B2
(45) Date of Patent: Mar. 21, 2006

(54) MULTI-LAYERED BARRIER METAL THIN FILMS FOR CU INTERCONNECT BY ALCVD

(75) Inventors: Wei Pan, Vancouver, WA (US); Yoshi Ono, Camas, WA (US); David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 116 days.

(21) Appl. No.: 09/819,296

(22) Filed: Mar. 27, 2001

(65) Prior Publication Data

US 2002/0140102 A1 Oct. 3, 2002

(51) Int. Cl.
*H01L 21/44* (2006.01)
(52) U.S. Cl. ............... 438/653; 438/627; 438/643; 438/648; 438/656; 438/687
(58) Field of Classification Search ........... 257/751, 257/761, 762, 763, 767; 438/627, 628, 629, 438/637, 643, 653, 674, 680, 687, 648, 656
See application file for complete search history.

(56) References Cited

U.S. PATENT DOCUMENTS

| | | | | |
|---|---|---|---|---|
| 6,284,646 | B1 * | 9/2001 | Leem | 438/629 |
| 6,368,954 | B1 * | 4/2002 | Lopatin et al. | 438/627 |
| 6,391,785 | B1 * | 5/2002 | Satta et al. | 438/704 |
| 6,703,708 | B1 * | 3/2004 | Werkhoven et al. | 257/751 |

* cited by examiner

*Primary Examiner*—Hung Vu
(74) *Attorney, Agent, or Firm*—Law Office of Gerald Maliszewski; Gerald Maliszewski

(57) ABSTRACT

A multi-layered barrier metal thin film is deposited on a substrate by atomic layer chemical vapor deposition (AL-CVD). The multi-layer film may comprise several different layers of a single chemical species, or several layers each of distinct or alternating chemical species. In a preferred embodiment, the multi-layer barrier thin film comprises a Tantalum Nitride layer on a substrate, with a Titanium Nitride layer deposited thereon. The thickness of the entire multi-layer film may be approximately fifty Angstroms. The film has superior film characteristics, such as anti-diffusion capability, low resistivity, high density, and step coverage, when compared to films deposited by conventional chemical vapor deposition (CVD). The multi-layered barrier metal thin film of the present invention has improved adhesion characteristics and is particularly suited for metallization of a Copper film thereon.

16 Claims, 3 Drawing Sheets

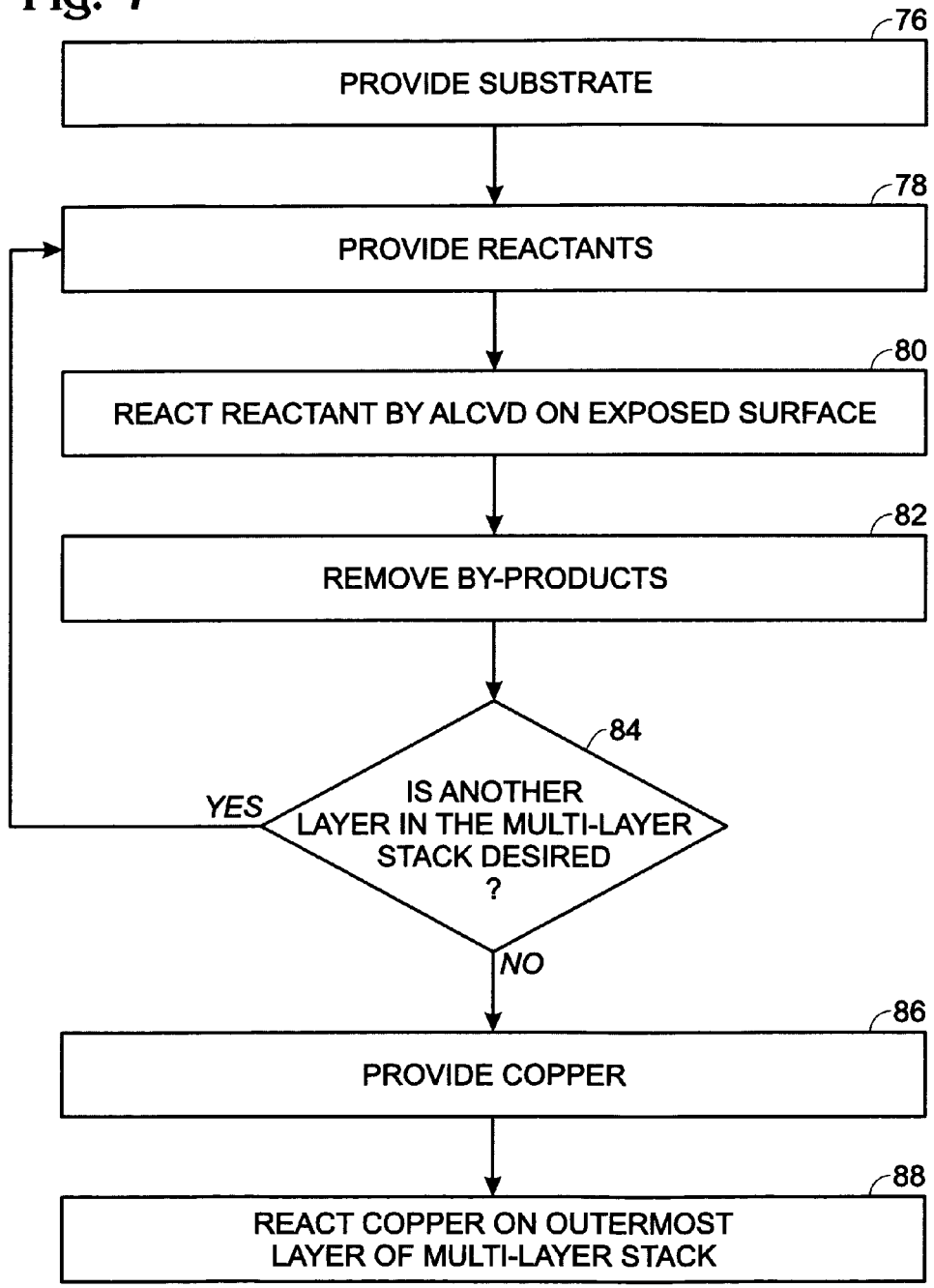

MULTI-LAYERED BARRIER METAL THIN FILMS FOR CU INTERCONNECT BY ALCVD

FIELD OF THE INVENTION

This invention relates to a multi-layered barrier metal thin film and a method of producing the same and, more particularly, to a multi-layered barrier metal thin film for copper interconnect wherein the multi-layered structure is manufactured by atomic layer chemical vapor deposition.

BACKGROUND OF THE INVENTION

In order to increase the speed of integrated circuit devices it is desired to manufacture the devices in as small a size as possible. By manufacturing the semiconductor devices with ever smaller sized features, the thickness of the barrier metal thin film for interconnect metallization within the device is also forced to be reduced.

However, the properties of the barrier metal thin film, such as its anti-diffusion capability, low resistivity, high density, step coverage, and other such properties, are required to remain the same or even improve. Conventional metal organic chemical vapor deposition (MOCVD), however, does not allow for the manufacture of films having a smaller thickness while having the same, or improved, film properties as thicker films.

Plasma densification performed on conventional chemical vapor deposition (CVD) barrier metal films may extend the capabilities of conventional CVD technology. However, due to the anisotropic nature of the plasma treatment, the film properties of the barrier metal film deposited on a side wall of a trench or a via are different from the film properties of the film deposited on the horizontal surfaces of the deposition surface. The blocking diffusion capability of the film is therefore reduced on the side wall of the trench or the via.

Additionally, conventional CVD barrier films contain carbon and other impurities that affect the density and resistivity of as-deposited barrier metal thin films. Accordingly, current technology is limited with regard to the thickness to which barrier metal films can be reduced and with regard to the properties of barrier metal films.

SUMMARY OF THE INVENTION

A multi-layered barrier metal thin film is deposited on a substrate by atomic layer chemical vapor deposition (ALCVD). The multi-layer film may comprise several different layers of a single chemical species, or several layers each of distinct or alternating chemical species. In a preferred embodiment, the multi-layer barrier thin film comprises a Tantalum Nitride (TaN) layer on a substrate with a Titanium Nitride (TiN) layer deposited thereon. The thickness of the entire multi-layer film is typically as small as fifty Angstroms. The film has superior film characteristics, such as anti-diffusion capability, low resistivity, high density, and step coverage, when compared to films deposited by conventional chemical vapor deposition (CVD). The multi-layered barrier metal thin film of the present invention has improved adhesion characteristics and is particularly suited for metallization of a Copper film thereon.

Accordingly, an object of the invention is to provide a multi-layer barrier metal film, and a method of producing the same.

Another object of the invention is to provide a multi-layer barrier metal film, and a method of producing the same, having improved film characteristics.

A further object of the invention is to provide a multi-layer barrier metal film, and a method of producing the same, wherein said film comprises multiple layers of a single chemical species, or several layers of distinct chemical species, deposited by the method of atomic layer chemical vapor deposition.

Still a further object of the invention is to provide a multi-layer barrier metal film having improved adhesion characteristics for the metallization of a Copper film thereon.

BRIEF DESCRIPTION OF THE DRAWINGS

FIG. 7 is flowchart of the method of the present invention.

DETAILED DESCRIPTION OF THE PREFERRED EMBODIMENTS

Atomic layer chemical vapor deposition (ALCVD) is an emerging technology that is being adopted in mainstream semiconductor research for eventual transfer to manufacturing. ALCVD uses fast operating valves to deliver individual reactants to a deposition chamber. Each reactant lays a mono-layer, i.e., an atomic layer, or several mono-layers, on the wafer structure through chemical adsorption and reacts with a previously deposited mono-layer species to form a desired compound. The as-formed compound will have a higher density than can be achieved by conventional CVD methods. The as-formed compound will also have excellent step coverage. By carefully selecting precursors, multi-layered or alternating layered barrier metal films are achievable. For example, alternating Tantalum Nitride/Silicon Nitride (TaN/SiN), Tantalum Nitride/Titanium Nitride (TaN/TiN) and Titanium Nitride/Silicon Nitride (TiN/SiN) thin films, or their combinations, are relatively easy to deposit using the ALCVD technology of the present invention. The entire film stack thickness typically is less than 100 Angstroms (100 A), preferably is less than 60 A, and can be as low as fifty Angrstroms (50A), and can exhibit superior barrier film properties.

In particular, a direct application for ALCVD barrier metal films deposited by the current invention is the multi-layered TaN/TiN film stack. TaN films have better barrier properties when compared to TiN but often exhibit poor adhesion for the subsequently deposited Copper (Cu) film, when compared to adhesion characteristics of TiN films. Single layer films also form grain structures that permit some diffusion along the grain boundaries. Accordingly a single layer film of either TaN or TiN has disadvantages. The TaN/TiN multi-layer stack, therefore, would be an attractive alternative for a barrier film for Cu metallization.

ALCVD barrier metal multi-layer thin films controlled to the atomic layer level are not possible with other deposition techniques. The ability to alternate from TiN to TaN, or to SiN, over several layers is unique to atomic layer chemical vapor deposition. The layer deposition achieved is also insensitive to surface orientation because of its self limited growth character, which means that the multi-layered deposition should be conformal and very uniform. Moreover, a thin layer of the multi-layer structure of the present invention should prevent diffusion of Copper metal as well as a much thicker, more pure Nitride of just Titanium or just Tantalum. The film density and resistivity of the thin multi-layer structure should also be superior to the thicker, pure TiN or pure TaN structure.

Figure 1:
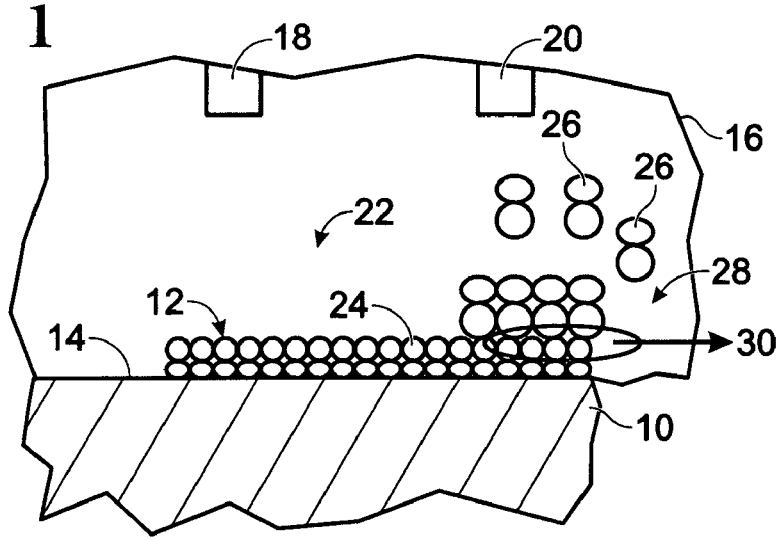
FIG. 1 is a schematic of the method of atomic layer chemical vapor deposition to deposit a multi-layer barrier metal film on a substrate.

Turning now to the drawings, FIG. 1 shows a schematic of the atomic layer chemical vapor deposition (ALCVD) process of the present invention. A substrate 10 is shown with a first chemical species 12 attached to a surface 14 of the substrate by the process of chemical adsorption. The term substrate is used herein to mean any type of structure adapted for the adsorption of first chemical species 12 thereon. Accordingly, substrate 10 may comprise a substrate as defined by conventional standards or may comprise the outermost layer of a previously deposited multi-layer stack, or any other such structure that defines a surface adapted for adsorption of chemical species 12 thereon. In particular, substrate 10 may comprise a substrate having the following general formulas: SiOx, SiOC, and other polymer materials, typically having a low-k.

Substrate 10 typically is positioned within a deposition chamber 16 which includes one or more valves, such as valves 18 and 20, and which defines an atmosphere 22 within said chamber. Substrate 10, and more particularly, surface 14 of the substrate, is in contact with atmosphere 22 of chamber 16. During the first step of the ALCVD process, first chemical species 12 is released into chamber 16 by a valve, such as valve 18. Valves 18 and 20 are fast operating valves that are capable of delivering individual reactants, or species, in predetermined quantities. The speed of the valves allows for operation times as short as a fraction of a second, such as approximately 0.4 second reaction times, depending on the chamber size. Upon release into chamber 16, first chemical species 12 attaches to surface 14 of substrate 10 by chemical adsorption. First chemical species 12 forms a mono-layer (i.e., one molecule thickness, or one atomic thickness), or several mono-layers (i.e., several molecules thick), 24 on surface 14. Chamber 16 is then cleared of the remaining first chemical species 12 within atmosphere 22 that is not adsorbed on surface 14. Purging of the chamber typically takes approximately three or four seconds, depending on the chamber size.

Valve 20, for example, may then introduce a second chemical species 26 into atmosphere 22. Second chemical species 26 reacts with first chemical species 12 in mono-layer 24 in a reaction represented by arrow 28. Reaction by-products 30 may or may not be released, depending on the chemical species utilized during reaction 28. In general, the first chemical species 12 may comprise a metal halide and the second chemical species 26 may comprise ammonia, an amine, other nitrogen gasses, or the like. The deposited film typically is a metal nitride and the by-products typically comprise halide acids, nitrogen, and the like. In a particular embodiment, wherein the deposited layer comprises TiN, first chemical species 12 may comrpise TiCl$_4$ and second chemical species 26 may comprise NH$_3$. The reaction results in a TiN film being deposited on surface 14, and reaction by-products 30 comprise HCl and N$_2$. The reaction is set forth in Equation (1).

$$TiCl_4 + NH_3 \rightarrow TiN + HCl + N_2 \tag{1}$$

The wafer temperature typically varies with the chemical species used in making the metal nitride thin film. Typically, the wafer temperature may be in a range of 300 to 600° C. The pressure of the reaction typically is not an important factor in ALCVD processes. However, the pressure typically will be in a range of 0.001 to 1.0 torr, depending on the reactor size. The time period of the reaction typically ranges from 0.4 to five seconds for introducing each species, which may vary by reactor size and chemical species. Several seconds typically is required for purging the reactor vessel between species.

For the deposition of a TaN mono-layer, the following reaction, shown in Equation (2), may be utilized.

$$TaCl_5 + NH_3 \rightarrow TaN + 3HCl + Cl_2 \tag{2}$$

For the deposition of a Si$_3$N$_4$ mono-layer, either of the following reactions, shown in Equations (3) and (4), may be utilized.

$$3SiCl_2H_2 + 4NH_3 \rightarrow Si_3N_4 + 6HCl + 6H_2 \tag{3}$$

$$3SiCl_4 + 4NH_3 \rightarrow Si_3N_4 + 12HCl \tag{4}$$

Figure 2:
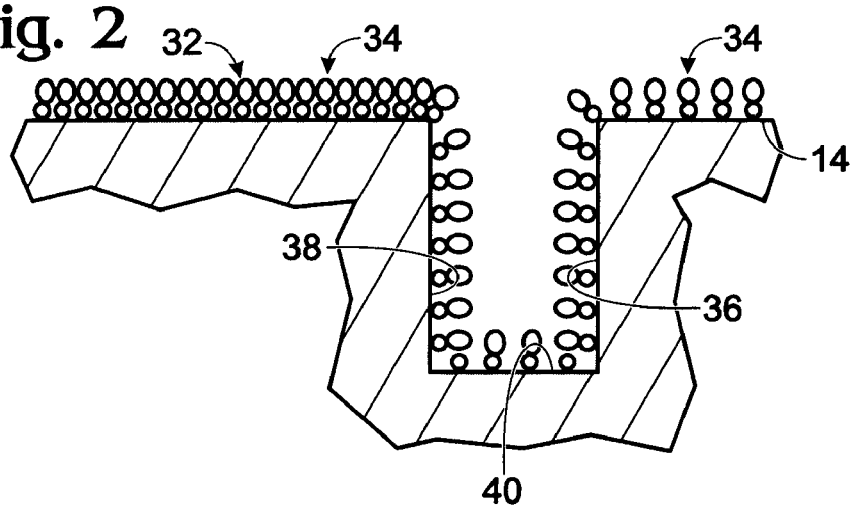
FIG. 2 is a schematic of the deposited multi-layer barrier metal film of FIG. 1.

FIG. 2 shows the results of reaction 28, namely, the formation of a compound 32 secured to surface 14 of substrate 10. Compound 32 defines one layer 34 of the multi-layer barrier metal structure, wherein the multi-layered structure has improved film characteristics, such as anti-diffusion capability, low resistivity, high density, and good step coverage, when compared to films deposited by conventional chemical vapor deposition (CVD). The multi-layered barrier metal thin film 34 also has improved adhesion characteristics and is particularly suited for metallization of a Copper film thereon. Layer 34 may comprise titanium nitride (TiN), tantalum nitride (TaN), tungsten (W), tungsten nitride (WN)or silicon nitride (Si$_3$N$_4$).

The ALCVD process disclosed herein results in an isotropic multi-layer film (shown in FIG. 4) comprised of multiple mono-layers 34 that are evenly distributed across surface 14 and throughout a trench or a via 36 in substrate 10. Those skilled in the art will understand that trench 36 is shown, merely for ease of illustration, in a size that is out of proportion with respect to the size of the chemical species. Film 34 is evenly distributed on side walls 38 and on the horizontal surfaces, such as bottom surface 40, of trench or via 36 such that the side walls and the bottom surface of the trench have the same or similar film properties. Accordingly, the blocking capability of side walls 38 is not reduced with respect to bottom surface 40 of the trench or via, as is the case with films produced by prior art CVD processes. Moreover, due to the controlled introduction of the first and second chemical species into atmosphere 22, mono-layer barrier metal film 34 does not contain carbon or other impurities that may affect the density and resistivity of the as-deposited multi-layer barrier film or films.

In other embodiments, more that two layers may be deposited on substrate 10. For example, for a five-layer film, five sets of first and second chemical species may be sequentially introduced into chamber 16 for reaction with the previously deposited mono-layer. The multiple layers may each be a unique chemical species, the same species, a particular chemical species may be used alternately between different chemical species, or any other combination as is desired. For each layer deposited, the first chemical species attaches to the deposition surface by chemical adsorption and reacts with a previously deposited mono-layer species, or the substrate surface in the case of the first deposited reactant. The second chemical species is then added to the reactant chamber to react with the first chemical species to form the mono-layer. Subsequent layers repeat the process by laying a mono-layer on the previous deposited layer. In this manner, the film stack is created having the desired film properties.

Figure 3:
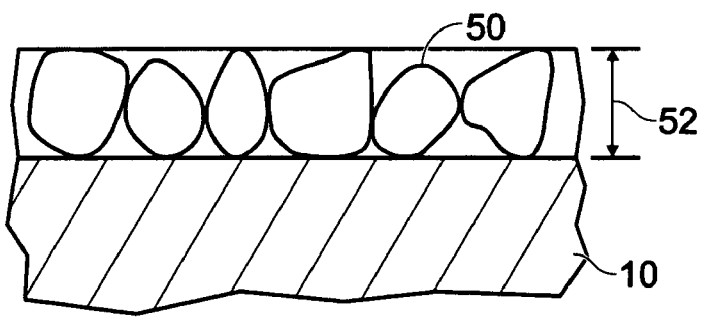
FIG. 3 is a detailed cross sectional view of the first deposited layer of a multilayer barrier metal film.

FIG. 3 shows a detailed cross sectional view of the first deposited layer 50 of the multi-layer barrier metal film. First layer 50, in a preferred embodiment, comprises TaN which has superior barrier properties but low adhesion characteristics for the deposition of Copper thereon. As shown in FIG. 3, first layer 50 is controlled to the atomic level, i.e., layer 50 has a thickness 52 which is the thickness of the TaN compound itself. Accordingly, the thickness of layer 50 is much smaller than the thickness of films heretofore achievable from prior art CVD processes. However, in other embodiments, thickness 52 may be on the order of several TaN molecules.

Figure 4:
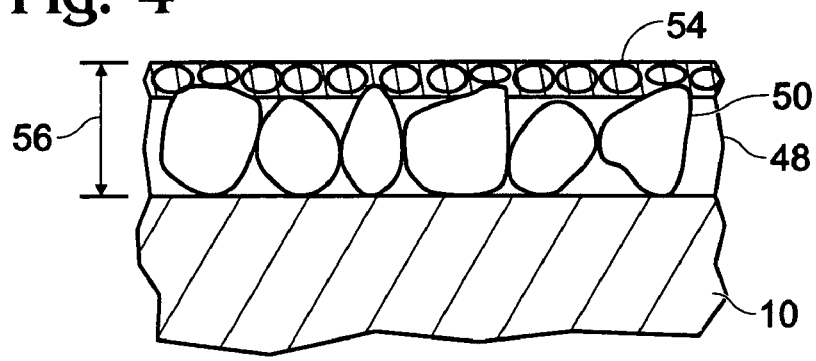
FIG. 4 is a detailed cross sectional view of a multi-layer barrier metal film comprising two layers each of a distinct chemical species.

FIG. 4 shows a detailed cross sectional view of a second deposited layer 54 deposited on first deposited layer 50 of multi-layer barrier metal film 48. Layers 50 and 54 together define a thickness 56 of film 48. In this embodiment, layer 54 comprises TiN so that layers 50 and 54 each comprise a distinct chemical species. The TiN layer may not have the same barrier properties of the TaN layer, but the TiN layer typically provides good adhesion for deposition of a copper thin film thereon. Thickness 56 of the two layers may be on the order of 50 Angstroms and typically will be less than 100A.

Figure 5:
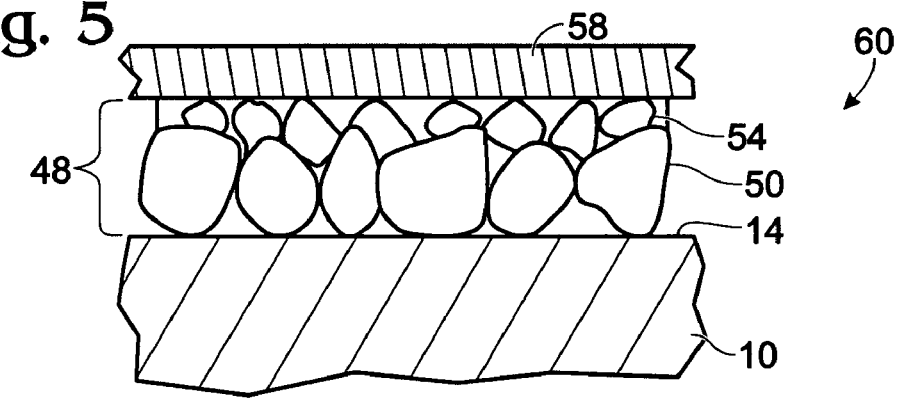
FIG. 5 shows the multi-layer barrier metal film of FIG. 4 with a Copper layer deposited thereon.

FIG. 5 shows the multi-layer barrier metal film of FIG. 4 with a Copper layer 58 deposited thereon. Upper or outermost layer 54 of stack 48 comprises TiN which has superior adhesion properties for the deposition of a Copper film thereon, when compared to the adhesion properties of a TaN film. Accordingly, Copper layer 58 typically will withstand standard tape tests and will resist peeling or flaking from multi-layer barrier metal film 48. Semiconductor device 60, which includes Copper film 58 and multi-layer barrier film 48, therefore, can be manufactured in a small size, and having superior film properties, than heretofore available.

Figure 6:
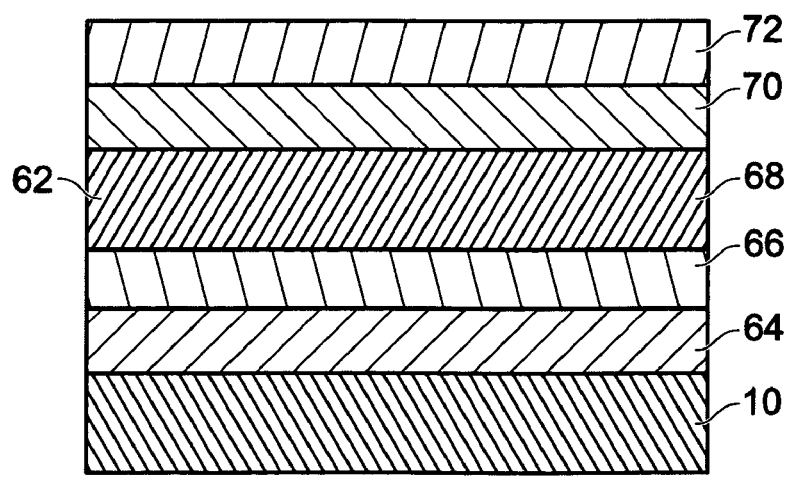
FIG. 6 shows a multi-layer barrier metal film having four layers and a Copper layer deposited thereon.

FIG. 6 shows a schematic of a multi-layer barrier metal film 62 having four layers, 64, 66, 68 and 70, each deposited by ALCVD. Innermost layer 64 is deposited by ALCVD on substrate 10. A Copper film 72 is adhered to the outermost layer 70 of the multi-layer stack 62. In one embodiment, layers 64 and 68 may comprise TaN whereas layers 66 and 70 may comprise TiN. In other embodiments, each of layers 64, 66, 68 and 70 may comprise TaN, TiN or $Si_3N_4$ so that a multi-layered structure 62 with a variety of layering sequences may be utilized. Of course, other numbers of mono-layers within the stack may be utilized.

FIG. 7 is a flowchart of the method of the present invention. Step 76 comprises providing a substrate having an exposed surface for the ALCVD reaction of a chemical species thereon. Step 78 comprises providing chemical species, or reactants, to the exposed surface of the substrate. Step 80 comprises reacting the reactants by ALCVD on the exposed surface of the substrate. This step typically takes place in an ALCVD chamber. In one step of a preferred method, wherein the first chemical species is $TaCl_5$ and the second chemical species is $NH_3$, the chamber will have a pressure in a range of 0.001 to 1.0 torr, a temperature in a range of 300 to 600° C., and a reaction time of approximately one second. Step 82 comprises removing the by-products of the reaction of step 80. For the example give above, the by-products would comprise HCl and $N_2$ and the film deposited would comprise TiN. However, in some methods, the by-products may be left in the reactant chamber because they will not interfere with subsequent reactions. Step 84 comprises deciding whether another layer in the multi-layer stack is desired. If so, the process returns to step 78 for repetition of the reaction with subsequent first and second chemical species. If not, the multi-layer barrier metal layer is complete. Step 86 comprises providing Copper to the reactant chamber. Step 88 comprises reacting the Copper, or other such subsequent layer or device, on the outermost layer of the multi-layer stack. In the preferred multi-layer stack, TiN is the outermost layer, which easily allows the adhesion of Copper thereto, and TaN is an inner layer having superior barrier qualitites.

Thus, a multi-layer barrier metal film, and a method of manufacturing the same by ALCVD, has been disclosed. Although preferred structures and methods of manufacturing the multi-layer film have been disclosed, it should be appreciated that further variations and modifications may be made thereto without departing from the scope of the invention as defined in the appended claims.

We claim:

1. A method of manufacturing a multi-layered barrier metal thin film by atomic layer chemical vapor deposition, comprising the steps of:
    providing a substrate in a reactant chamber;
    providing a first chemical species comprising a first metal, in said reactant chamber;
    providing a second chemical species in said reactant chamber, wherein said first and second chemical species react to deposit a first layer of a barrier metal thin film of a first metal nitride on said substrate by atomic layer chemical vapor deposition;
    providing a third chemical species comprising a second metal of a different material than the first metal, in said reactant chamber; and
    providing a fourth chemical species in said reactant chamber, wherein said third and fourth chemical species react to deposit a second layer of said barrier metal thin film of a second metal nitride directly on said first layer by atomic layer chemical vapor deposition;
    wherein said barrier metal thin film deposited on said substrate defines a thickness of less than 100 Angstroms;
    wherein said first layer of said barrier metal thin film and said second layer of said barrier metal thin film are each chosen from the group consisting of TiN, TaN, and WN.

2. The method of claim 1 further comprising depositing a thin copper film on said barrier metal thin film.

3. The method of claim 1 wherein said thickness of said barrier metal thin film is equal to an atomic thickness of said first and said second metal nitrides.

4. The method of claim 1 wherein said substrate comprises a trench having a bottom surface and a side wall, and wherein said barrier metal thin film is deposited on said bottom surface and said side wall by atomic layer chemical vapor deposition such that said barrier metal thin film defines a blocking diffusion characteristic which is the same on said side wall and said bottom surface.

5. A method of manufacturing a multi-layered barrier metal thin film by atomic layer chemical vapor deposition, comprising the steps of:
    providing a substrate in a reactant chamber;
    providing a first chemical species comprising a first metal, in said reactant chamber;
    providing a second chemical species in said reactant chamber, wherein said first and second chemical species react to deposit a first barrier metal thin film of a first metal nitride on said substrate by atomic layer chemical vapor deposition;

providing a third chemical species comprising a second metal of a different material than the first metal, in said reactant chamber;

providing a fourth chemical species in said reactant chamber, wherein said third and fourth chemical species react to deposit a second barrier metal thin film of a second metal nitride directly on said first barrier metal thin film by atomic layer chemical vapor deposition;

wherein said first barrier metal thin film and said second barrier metal thin film are each chosen from the group consisting of TiN, TaN, and WN.

6. The method of claim 5 wherein said method is conducted at a temperature in a range of 300 to 600° C., at a pressure in a range of 0.001 to 1.0 torr, and wherein each atomic layer chemical vapor deposition step is conducted for a time period in a range of 0.4 to 5.0 seconds.

7. The method of claim 5 further comprising providing a fifth chemical species comprising a third metal, in said reactant chamber and providing a sixth chemical species in said reactant chamber, wherein said fifth and sixth chemical species react to deposit a third barrier metal thin film of a metal nitride on said second barrier metal thin film by atomic layer chemical vapor deposition.

8. The method of claim 5 further comprising depositing a thin copper film on said second barrier metal thin film.

9. The method of claim 5 wherein said first barrier metal thin film and said second barrier metal thin film together define a layered structure having a thickness of less than 60 Angstroms.

10. The method of claim 5 wherein said first chemical species comprises a first metal halide and said second chemical species comprises a nitrogen containing gas.

11. A method of manufacturing a multi-layered barrier metal thin film by atomic layer chemical vapor deposition, comprising the steps of:

providing a substrate in a reactant chamber;

depositing a first layer of a first metal nitride on said substrate by atomic layer chemical vapor deposition; and depositing a second layer of a second metal nitride overlying said first layer, without an intervening material layer, by atomic layer chemical vapor deposition;

wherein said first metal nitride is a different material than said second metal nitride;

wherein said first and second metal nitrides are each chosen from the group consisting of TiN, TaN, and WN.

12. The method of claim 11 further comprising depositing a third layer of a third metal nitride on said second layer by atomic layer chemical vapor deposition, wherein said third metal nitride is a different material than said first and said second metal nitrides.

13. The method of claim 11 wherein said multi-layered barrier metal thin film deposited on said substrate defines a thickness of less than 100 Angstroms.

14. The method of claim 11 further comprising depositing a third layer of said first metal nitride on said second layer by atomic layer chemical vapor deposition, and depositing a fourth layer of said second metal nitride on said third layer by atomic layer chemical vapor deposition such that said multi-layered barrier metal thin film comprises alternating layers of said first and second metal nitrides.

15. A method of manufacturing a multi-layered barrier metal thin film by atomic layer chemical vapor deposition, comprising the steps of:

providing a substrate in a reactant chamber;

depositing a first layer of a first metal nitride on said substrate by atomic layer chemical vapor deposition; and depositing a second layer of a second metal nitride overlying said first layer, without an intervening material layer, by atomic layer chemical vapor deposition;

depositing a third layer of a third metal nitride on said second layer by atomic layer chemical vapor deposition; and, wherein said first metal nitride is a different material than said second metal nitride, and said third metal nitride is a different material than said first and said second metal nitrides.

16. A method of manufacturing a multi-layered barrier metal thin film by atomic layer chemical vapor deposition, comprising the steps of:

providing a substrate in a reactant chamber;

depositing a first layer of a first metal nitride on said substrate by atomic layer chemical vapor deposition; and depositing a second layer of a second metal nitride overlying said first layer, without an intervening material layer, by atomic layer chemical vapor deposition;

depositing a third layer of said first metal nitride on said second layer by atomic layer chemical vapor deposition, and depositing a fourth layer of said second metal nitride on said third layer by atomic layer chemical vapor deposition such that said multi-layered barrier metal thin film comprises alternating layers of said first and second metal nitrides; and, wherein said first metal nitride is a different material than said second metal nitride.

* * * * *